(12) United States Patent
Seto et al.

(10) Patent No.: US 7,413,290 B2
(45) Date of Patent: Aug. 19, 2008

(54) PIEZOELECTRIC ELEMENT, DROPLET-EJECTING HEAD, AND DROPLET-EJECTING APPARATUS

(75) Inventors: Shinji Seto, Kanagawa (JP); Takashi Yagi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 376 days.

(21) Appl. No.: 11/338,984

(22) Filed: Jan. 25, 2006

(65) Prior Publication Data
US 2007/0019040 A1 Jan. 25, 2007

(30) Foreign Application Priority Data
Jul. 25, 2005 (JP) .............................. 2005-214934

(51) Int. Cl.
*B41J 2/045* (2006.01)
(52) U.S. Cl. .......................................... 347/68; 347/72
(58) Field of Classification Search .................... 347/68, 347/70–72
See application file for complete search history.

(56) References Cited

U.S. PATENT DOCUMENTS 6,494,567 B2 * 12/2002 Murai ......................... 347/71
7,008,048 B2 * 3/2006 Sakaida ........................ 347/68
2005/0052506 A1 3/2005 Takashi et al.

FOREIGN PATENT DOCUMENTS

EP 0 794 579 9/1997
JP 10 264384 10/1998

* cited by examiner

*Primary Examiner*—An H Do
(74) *Attorney, Agent, or Firm*—Fildes & Outland, P.C.

(57) ABSTRACT

The present invention provides a piezoelectric element at least including a piezoelectric layer, a first higher-potential electrode layer formed in contact with the piezoelectric layer on one face of the piezoelectric layer, and a second lower-potential electrode layer formed in contact with the piezoelectric layer on the face of the piezoelectric layer opposite to the first electrode layer, wherein the first electrode layer contains a metal A having a standard electrode potential of higher than 0 V and a metal B having a standard electrode potential higher than that of the metal A in which the metal A is present in the largest amount by weight of the total amount of the metal elements contained in the first electrode layer, the second electrode layer contains a metal C having a standard electrode potential lower than that of the metal A, in which the metal C is present in the largest amount by weight of the total amount of the metal elements contained in the second electrode layer.

22 Claims, 8 Drawing Sheets

F I G. 1
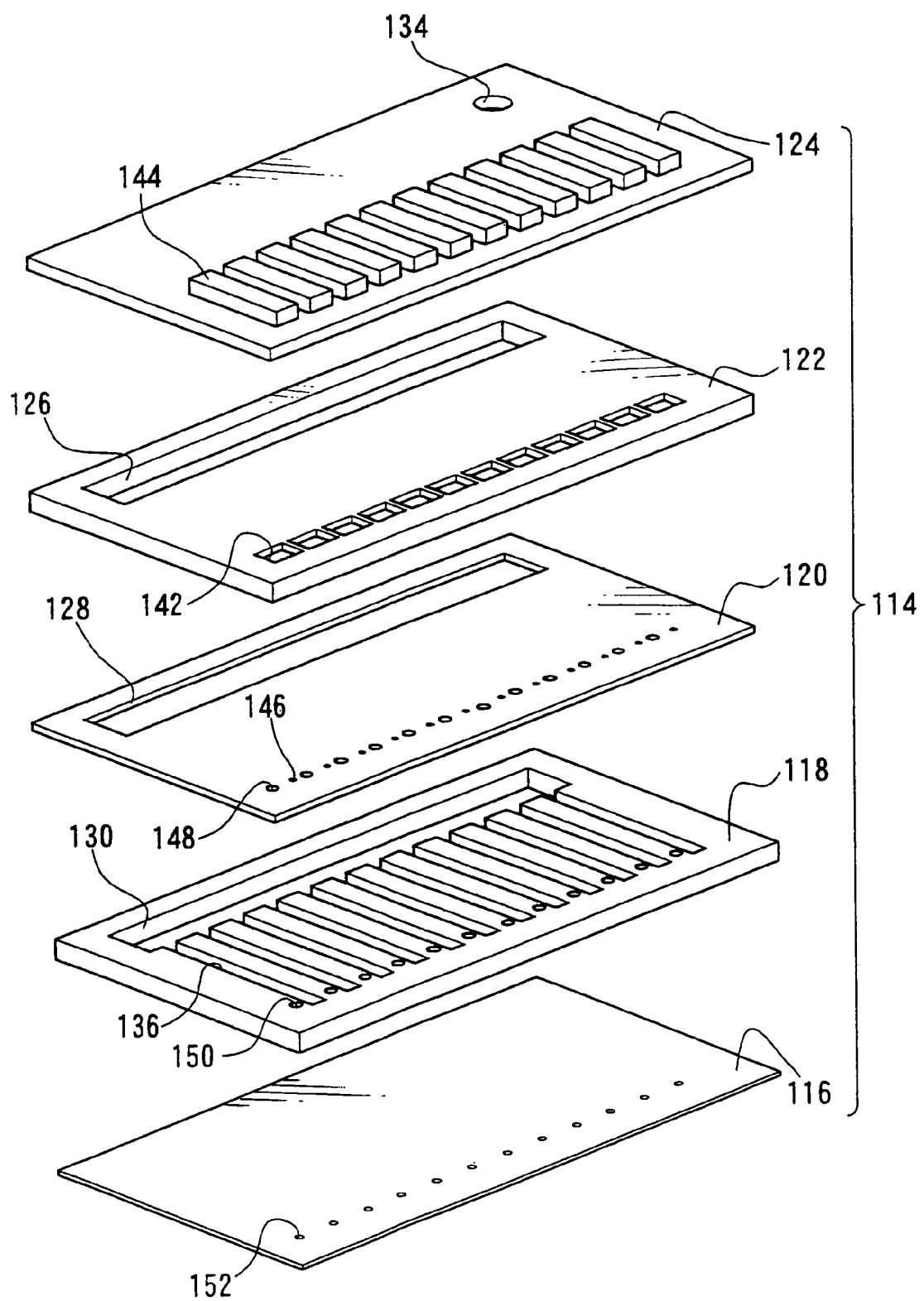

F I G. 5
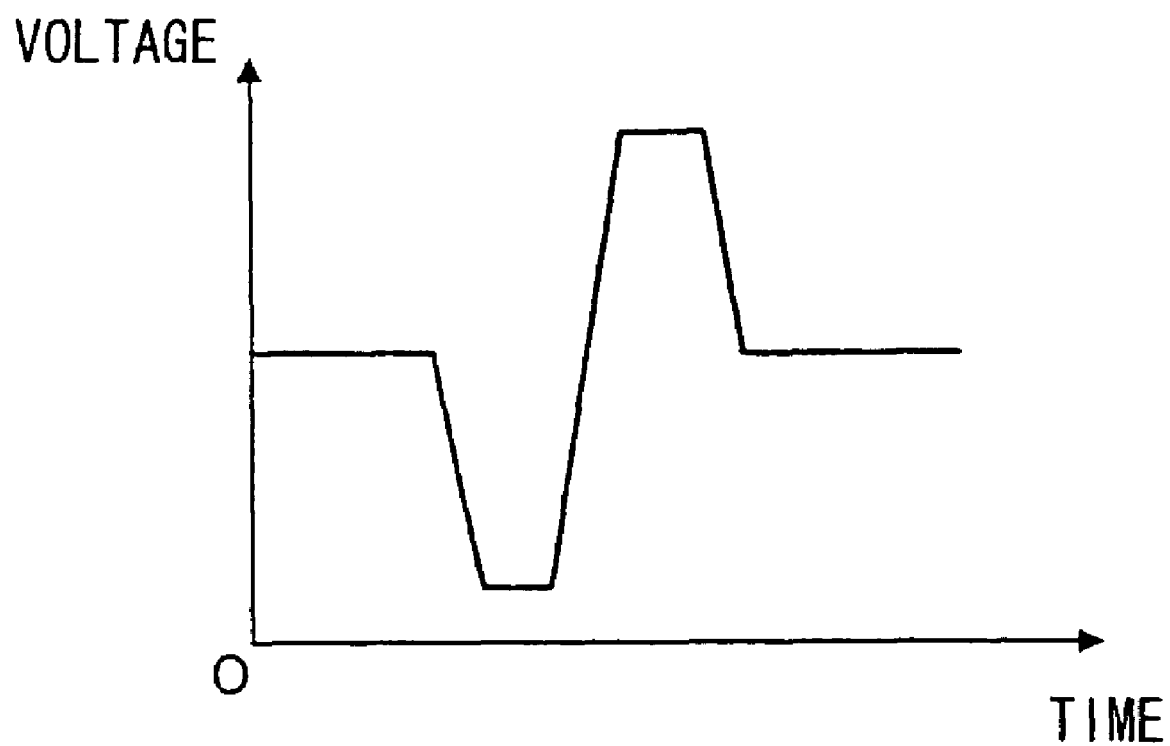

F I G. 8
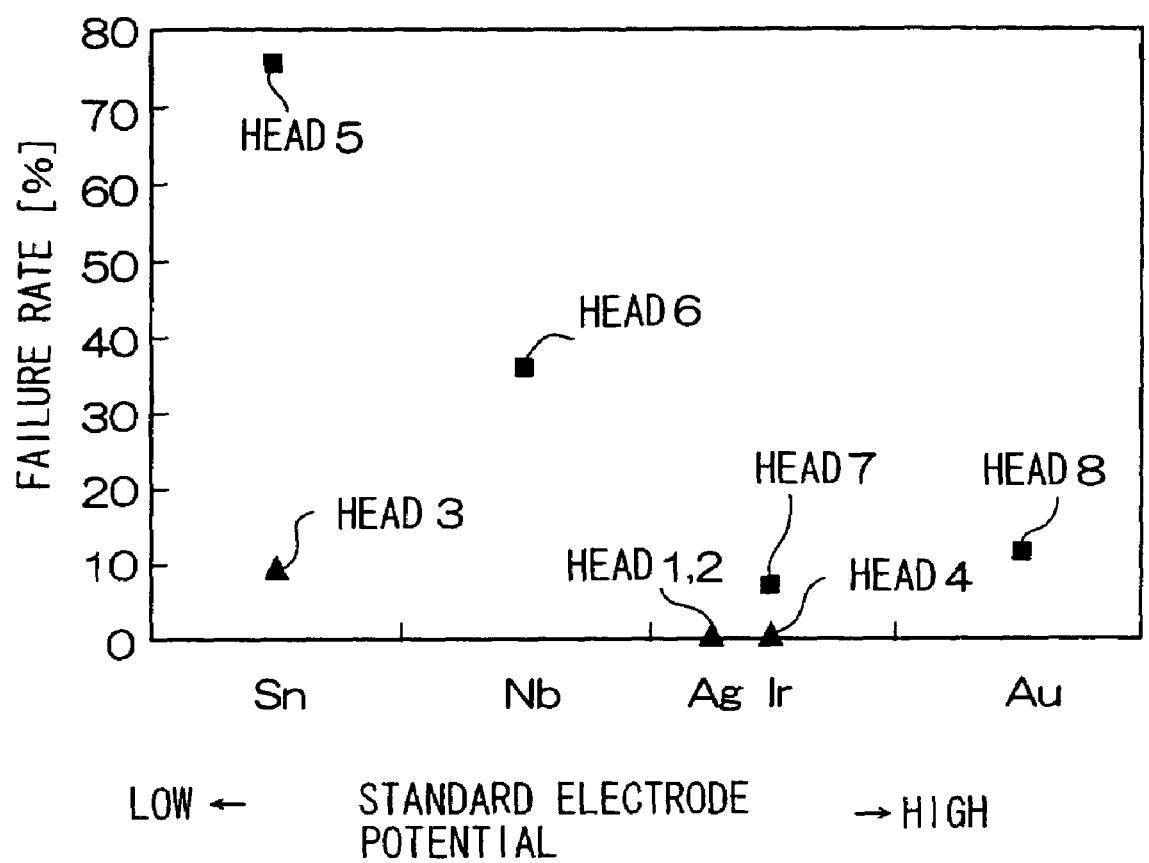

US 7,413,290 B2

PIEZOELECTRIC ELEMENT, DROPLET-EJECTING HEAD, AND DROPLET-EJECTING APPARATUS

CROSS-REFERENCE TO RELATED APPLICATION

This application claims priority under 35 USC 119 from Japanese Patent Application No. 2005-214934, the disclosure of which is incorporated by reference herein.

BACKGROUND OF THE INVENTION

1. Field of the Invention

The present invention relates to a piezoelectric element, a droplet-ejecting head and a droplet-ejecting apparatus, and in particular, to a piezoelectric element, for example, for recording characters and images on a recording medium by ejecting droplets and forming fine patterns or thin films on a substrate, a droplet-ejecting head using the piezoelectric element, and a droplet-ejecting apparatus using the droplet-ejecting head.

2. Description of the Related Art

Droplet-ejecting heads, which generate pressure wave (acoustic wave) in liquid filled in a pressure-generating chamber by using a pressure-generating means such as a piezoelectric actuator and eject droplets through a nozzle connected to the pressure-generating chamber (or pressure chamber) by the pressure wave, are generally known well. Such a piezoelectric actuator generally consists of a piezoelectric element that deforms according to image information and a vibration plate that vibrates by deformation of the piezoelectric element and expands or compresses the pressure-generating chamber.

To ensure long-term reliability of the piezoelectric actuator, it is necessary to overcome problems such as troubles of the piezoelectric element during operation, especially under highly humid environment (in particular, deterioration of capacity caused by generation of oxygen holes and elution of lead ion) and defects in electrode film (electromigration), and thus, electrodes in various configurations were studied.

For example, known is a case a method of using a base metal as the electrode in a piezoelectric element (e.g., JP-A No. 2004-152911). The invention of JP-A No. 2004-152911 prevents reducing reaction of piezoelectric elements by forming top and bottom electrodes with different metals.

Also known is a method of forming an electrode layer with a composition resistant to the reducing action due to moisture (e.g., JP-A No. 10-264384). The invention of JP-A No. 10-264384 suppresses electrolysis of water and thus prevents the reducing reaction of piezoelectric member by forming two electrode layers made of different metals on a piezoelectric element and regulating the relationship between the standard electrode potentials thereof.

Also known is a method of forming a conductive metal oxide layer on the positive side electrode of a piezoelectric element and additionally a metal layer for solder junction thereon (e.g., JP-A No. 2001-88296). The invention of JP-A No. 2001-88296, which uses a metal which can form solder junction as the principal metal in the positive electrode and forms a layer of an alloy containing, for example, a noble metal for prevention of Pb-ion elution, allows reduction in the thickness of metal layer, and is thus, advantageous from the points of productivity and cost reduction.

In addition, a method of using a metal having a standard electrode potential of 0 V or more as the high-electric potential electrode and a metal oxide as the low-electric potential electrode is also known (e.g., JP-A No. 2005-32955). The invention of JP-A No. 2005-32955 suppresses electrolysis of water and prevents reducing reaction of the piezoelectric element, by regulating the relationship between the standard electrode potentials of the top and bottom electrodes. It is also possible to obtain favorable electrical properties (in particular, conductivity) reliably by forming a layer other than metal oxide layer as the low-electric potential electrode.

However, the conventional inventions described above could not prevent deterioration of the piezoelectric element over time sufficiently when it is used under high-temperature and high-humidity environment.

SUMMARY OF THE INVENTION

The present invention has been made in view of the above circumstances and provides a piezoelectric element capable of preventing deterioration thereof over time under high-temperature and high-humidity environment, a droplet-ejecting head using the piezoelectric element, and a droplet-ejecting apparatus using the droplet-ejecting head.

That is, the invention provides a piezoelectric element, at least comprising a piezoelectric layer, a first higher-potential electrode layer formed in contact with the piezoelectric layer on one face of the piezoelectric layer, and a second lower-potential electrode layer formed in contact with the piezoelectric layer on the face of the piezoelectric layer opposite to the first electrode layer, wherein the first electrode layer contains a metal A having a standard electrode potential of higher than 0 V and a metal B having a standard electrode potential higher than that of the metal A, and in which metal A is present in the largest amount by weight of the total amount of the metal elements contained in the first electrode layer and in which metal of B is an amount of 0.5 to 35% by weight with respect to the total amount of the metal elements contained in the first electrode layer, and the second electrode layer contains a metal C having a standard electrode potential lower than that of the metal A and in which the metal C is present in the largest amount by weight of the total amount of the metal elements contained in the second electrode layer of the piezoelectric element; a droplet-ejecting head using the piezoelectric element; and a droplet-ejecting apparatus using the droplet-ejecting head.

BRIEF DESCRIPTION OF THE DRAWINGS

FIG. 1 is a perspective view illustrating an embodiment of the droplet-ejecting head according to the present invention.

FIG. 5 is a figure showing an example of drive voltage waveform.

FIG. 8 is a figure showing the evaluation results in Examples.

DETAILED DESCRIPTION OF THE INVENTION

Figure 2:
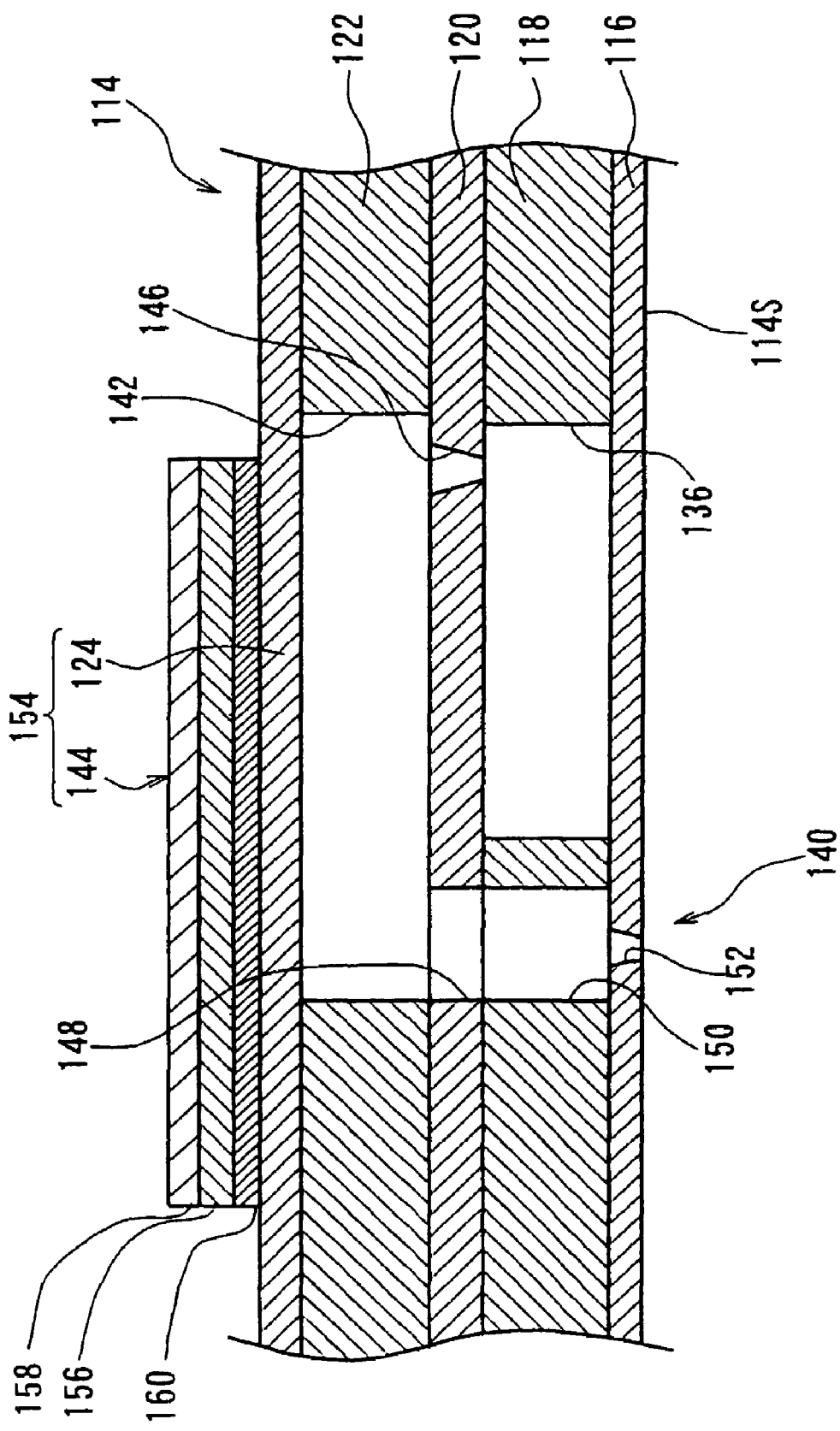
FIG. 2 is a partial sectional view illustrating an embodiment of the droplet-ejecting head according to the invention.

Hereinafter, the piezoelectric element, droplet-ejecting head and droplet-ejecting apparatus according to the present invention will be described in detail.

<Piezoelectric Element>

The piezoelectric element according to a first embodiment of the invention is a piezoelectric element at least comprising a piezoelectric layer, a first higher-potential electrode layer formed in contact with the piezoelectric layer on one face of the piezoelectric layer, and a second lower-potential electrode layer formed in contact with the piezoelectric layer on the face of the piezoelectric layer opposite to the first electrode layer, wherein the first electrode layer contains a metal A having a standard electrode potential of higher than 0 V and a metal B having a standard electrode potential higher than that of the metal A in which metal the A is present in the largest amount by weight of the total amount of the metal elements contained in the first electrode layer and in which the metal B is an amount of 0.5 to 35% by weight with respect to the total amount of the metal elements contained in the first electrode layer, and the second electrode layer contains a metal C having a standard electrode potential lower than that of the metal A in which the metal C is present in the largest amount by weight of the total amount of the metal elements contained in the second electrode layer.

The piezoelectric element according to the invention contains a metal A having a standard electrode potential of higher than 0 V and a metal B having a standard electrode potential higher than that of the metal A in the first higher-potential electrode layer respectively in particular amounts and a metal C having a standard electrode potential lower than that of the metal A in the second lower-potential electrode layer in a particular amount, and thus, hardly causes electrolysis of water. Accordingly, it is possible to prevent deterioration of the piezoelectric element due to hydrogen ion generated by the electrolysis of water. In particular, it is possible to prevent deterioration of the piezoelectric element under high-humidity environment.

In the invention, the "standard electrode potential" is a value represented by ΔV in the reaction defined by the following Formula (1).

Mn++ne− →M+ΔV    Formula (1)

In Formula (1), Mn+ represents a metal ion; M represents a metal atom; n is an integer of one or more; e− represents an electron; and ΔV represents a standard electrode potential (V).

In Formula (1), if a metal M has different integers n (i.e., a metal atom M has two or more different ionic states), ΔV at an integer n when the ΔV value is the smallest is used as the standard electrode potential in the invention.

The metals contained in the electrode layers according to the invention may be present in the state of compounds such as oxide and nitride. In such a case, the standard electrode potential of the metals is that of the pure metals for the compounds.

When the content of metal B is less than 0.5% by weight with respect to the total amount of the metal elements contained in the first electrode layer, problems such as electromigration and elution of Pb ion out of the piezoelectric element may occur. Alternatively, a content higher than 35% by weight results in an increase in cost. The content of the metal B is preferably 1 to 20% by weight with respect to the total amount of the metal elements contained in the first electrode layer.

The material for the piezoelectric layer is not particularly limited, if it is a known piezoelectric material that deforms when a voltage is applied, and, for example, use of a lead zirconate titanate (PZT)-based piezoelectric material having a relatively larger piezoelectric constant in the piezoelectric droplet-ejecting element is preferable, form the viewpoint of desirable properties. In particular, modified PZT's containing a donor (e.g., Nb, etc.) have a greater piezoelectric constant and thus, are favorable in the droplet-ejecting application. However, some of the donor-containing PZT's show deterioration over time because of their lower environment resistance, and thus, application of the invention is significantly advantageous.

The thickness of the piezoelectric layer is not particularly limited, but practically, preferably in the range of 1 to 50 μm.

The metal A is not particularly limited if it satisfies the particular relationships with metals B and C, however metals which can be soldered are preferable. In this manner, it is possible to provide the first electrode layer with soldering capability, and thus, there is no need for forming an additional layer which can be soldered on the first electrode layer for the purpose of providing soldering capability, leading to cost reduction.

The metal C is also not particularly limited if it satisfies the particular relationship with the metal A, however metals which can be soldered are preferable for the reasons described above.

In the invention, the metal A is preferably Ag, because it is possible to give the first electrode layer soldering capability. The metal A is also preferably Cu, because it prevents electromigration more effectively than Ag.

The metal B is not particularly limited as long as it satisfies the particular relationship with the metal A, but is preferably Ir, Pt or Pd. If Pt or Pd is used as the metal B, it is possible to reduce the elution of Pb ion out of the piezoelectric layer that occurs at high electric potential when a Pb-containing PZT is used as the piezoelectric layer. It is also possible to reduce the electromigration of Ag when Ag is used as the metal A.

In addition, IrO2, an oxide of Ir, is favorable, because it is more adhesive to the piezoelectric layer.

The metal C is not particularly limited as long as it satisfies the particular relationship with the metal A, but preferably Sn, Ti, Al, Zn, Cu, Ni or Pb. Use of the metal above as the metal C allows cost-effective production of the electrode.

In addition, SnO, an oxide of Sn, supplies oxygen to the piezoelectric layer and functions to replenish the oxygen holes reduced during use in the piezoelectric element.

In addition, use of a metal having a standard electrode potential of less than 0 V as the metal C is preferable, because it prevents electrolysis of water in combination with metal A.

As for the combination of metals A and C for use in the piezoelectric element in the first embodiment, combination of Ag or Cu as metal A and Sn, Ti, Al, Zn, Cu, Ni or Pb as metal C is preferable, and combination of Ag as metal A and Ti or Sn as metal C is more preferable.

As for the combination of metals A, B and C for use in the piezoelectric element in the first embodiment, combination of Ag or Cu as metal A, Ir, Pt or Pd as metal B, and Sn, Ti, Al, Zn, Cu, Ni or Pb as metal C is preferable; and combination of Ag as metal A, Pd as metal B, and Ti or Sn as metal C is more preferable.

In the piezoelectric element in the second embodiment of the invention, the second electrode layer contains a metal D having a standard electrode potential higher than that of the metal C additionally in an amount of 0.5 to 35% by weight with respect to the total amount of the metal elements contained in the second electrode layer.

Typical examples of the metals A, B and C for use in the piezoelectric element in the second embodiment, the differences among them in standard electrode potential, and others are the same as those in the piezoelectric element in the first embodiment.

When the content of metal D is less than 0.5% by weight with respect to the total amount of the metal elements contained in the second electrode layer, electromigration or elution of Pb ion may take place. Alternatively, a content of more than 35% by weight may cause a problem of deterioration in the capability of preventing electrolysis of water.

The content of the metal D is preferably 1 to 20% by weight with respect to the total amount of the metal elements contained in the second electrode layer.

The metal D is not particularly limited as long as it satisfies the particular relationship with the metal C, but preferably Ir, Pt or Pd. By using Pt or Pd as the metal D, it is possible to reduce elution of Pb ion out of the piezoelectric layer when a Pb-containing PZT is used as the piezoelectric layer.

As for the combination of the metal A and metal C for use in the piezoelectric element in the second embodiment, combination of Ag or Cu as metal A and Sn, Ti, Al, Zn, Cu, Ni or Pb as metal C is preferable; and combination of Ag as metal A and Ti or Sn as metal C is more preferable.

As for the combination of the metals A, B, C and D for use in the piezoelectric element in the second embodiment, combination of Ag or Cu as metal A, Ir, Pt or Pd as metals B and D, Sn, Ti, Al, Zn, Cu, Ni or Pb as metal C is preferable; and combination of Ag as metal A, Pd as metals B and D, and Ti or Sn as metal C is more preferable.

The thickness of the first and second electrode layers is preferably in the range of 0.1 to 2 μm and more preferably 0.2 to 1 μm.

In the piezoelectric element according to the invention, a protective layer (e.g., an inorganic film of silicon oxide, silicon nitride, or the like, or an organic film of polyimide, parylene, or the like) or a metal layer of a metal which can be soldered may be formed on the surface of the first and/or the second electrode layers, for prevention of deterioration of the piezoelectric properties of the element over a long period of time and for providing the electrode layer with soldering capability.

The method of producing the piezoelectric element according to the invention is not particularly limited, and it may be produced in a similar manner to conventional piezoelectric elements. For example, the material for electrode layer described above may be deposited on a plate of a piezoelectric material previously fabricated in a desirable thickness, by a known filming method, for example, by a gas-phase filming method such as sputtering or vapor deposition.

The plate-shaped piezoelectric element larger in size thus prepared may be used, for example, for production of droplet-ejecting heads, by fabricating it into pieces in a desired size by a known processing method such as dicing and blasting.

Alternatively, if the piezoelectric element according to the invention is used only for production of a droplet-ejecting head having a vibration plate, the piezoelectric element may be formed by depositing and laminating each layer for the piezoelectric element one by one on a substrate vibration plate by using a liquid-phase or gas-phase filming method exemplified above.

<Droplet-ejecting Head and Droplet-ejecting Apparatus>

Hereinafter, the droplet-ejecting head according to the invention and the droplet-ejecting apparatus using the same will be described. The droplet-ejecting head according to the invention is not particularly limited if it can eject a droplet through a nozzle by using the piezoelectric element according to the invention, but specifically, a head having the following configuration is preferable.

The droplet-ejecting head according to the invention preferably has at least a pressure-generating chamber filled with a liquid, a nozzle communicating with the pressure-generating chamber that can eject droplet, a vibration plate constituting at least part of the wall of the pressure-generating chamber that expands or contracts the pressure-generating chamber by vibration, and an actuator at least having the piezoelectric element according to the invention that vibrates the vibration plate by deformation caused by a voltage applied according to image information. The droplet-ejecting apparatus according to the invention is also not particularly limited, as long as the apparatus has at least the droplet-ejecting head according to the invention.

Hereinafter, a typical example of the droplet-ejecting head according to the invention will be described with reference to drawings.

Figure 3:
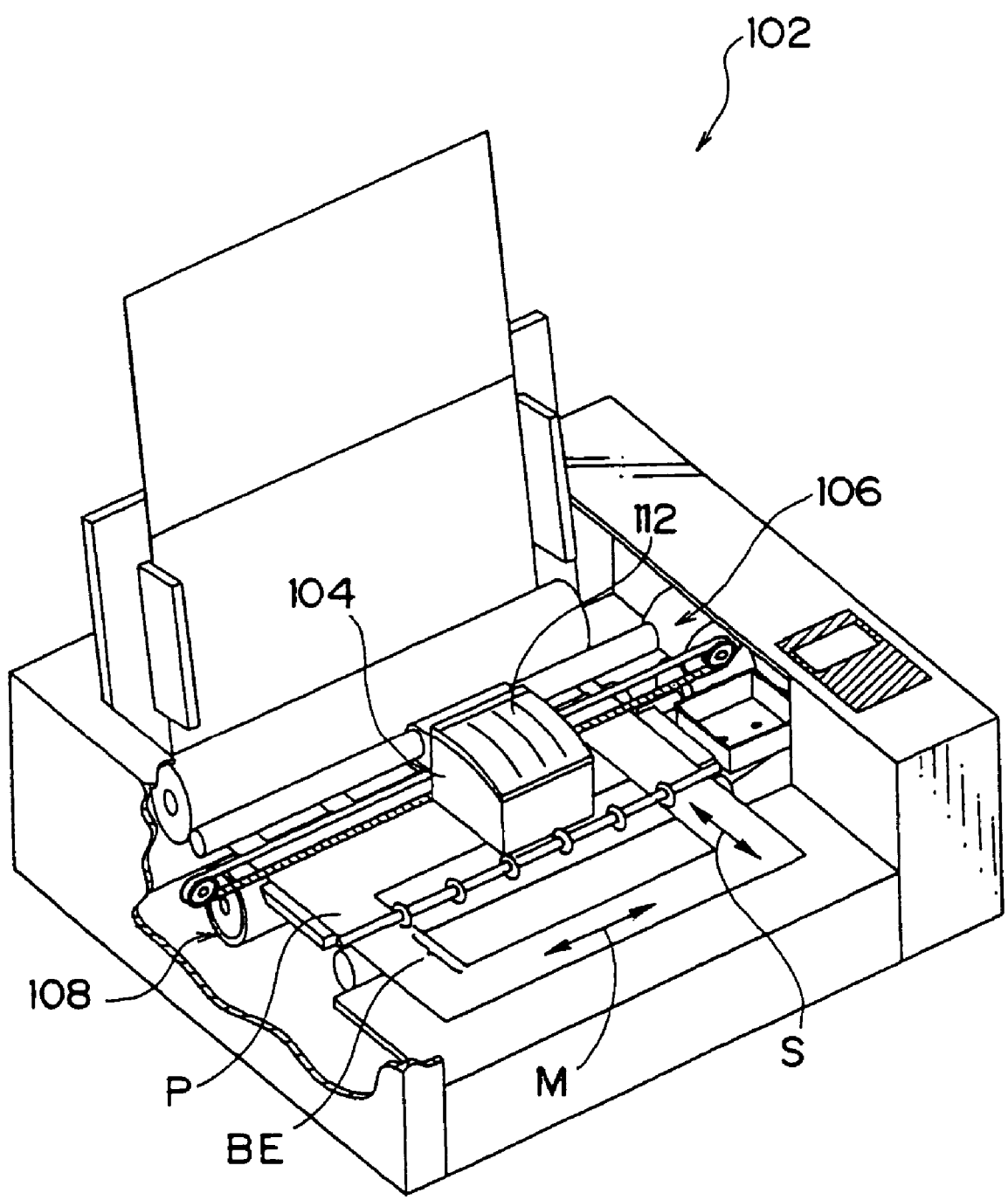
FIG. 3 is a perspective view illustrating an embodiment of the droplet-ejecting apparatus according to the invention.

FIG. 1 is a partial perspective view illustrating a droplet-ejecting head in the first embodiment of the invention; FIG. 2 is a partial sectional view illustrating the droplet-ejecting head in the first embodiment of the invention (shown in FIG. 1); and FIG. 3 shows a droplet-ejecting apparatus having the droplet-ejecting head according to the invention (shown in FIGS. 1 and 2). The same denotations are attached to the members having the same function in the Figs. above, and duplicated description thereof is omitted.

A droplet-ejecting unit in a droplet-ejecting head 112 according to the invention is shown partially in FIGS. 1 and 2. A droplet-ejecting apparatus 102 having the droplet-ejecting head 112 is shown in FIG. 3. The droplet-ejecting head 112 in this embodiment is a so-called inkjet-recording head, and the droplet-ejecting apparatus 102 having the droplet-ejecting head 112 is an inkjet-recording apparatus. The droplet-ejecting apparatus 102 ejects color ink droplets (ink droplets) through the nozzles 140 in the droplet-ejecting head 112 onto a recording medium, recording paper P, and records an image with the dots formed by the droplets.

As shown in FIG. 3, the droplet-ejecting apparatus 102 has a carriage 104 carrying the droplet-ejecting head 112, a main scanning mechanism 106 moving the carriage 104 in the predetermined main-scanning direction along the recording surface of a recording paper P (main scanning), and a sub-scanning mechanism 108 moving the recording paper P in the particular subscanning direction crossing (preferably, orthogonal to) the main scanning direction (subscanning). In FIG. 3, the main and subscanning directions are indicated respectively by arrows M and S.

The droplet-ejecting head 112 is mounted on the carriage 104 having a nozzle 140 described below formed therein in which a nozzle face 114S faces the recording paper P (see FIG. 2), and ejects droplets onto the recording paper P and records an image in a particular band region BE thereof while moving in the main scanning direction driven by the main scanning mechanism 106. After the movement in the main scanning direction once, the recording paper P is fed in the subscanning direction by the subscanning mechanism 108, and an image is recorded once again in the next band region while the carriage 104 is driven in the main scanning direction. An image is formed in the entire surface of the recording paper P while the operation is repeated multiple times.

As apparent from FIGS. 1 and 2, the droplet-ejecting head 112 has a laminated flow-channel plate 114. The laminated flow-channel plate 114 is prepared in such a manner that a total of five plates, a nozzle plate 116, a flow-channel plate 118, an ink-supplying flow-channel plate 120, a pressure-generating chamber plate 122, and a vibration plate 124, are positioned, laminated and bonded with bonding means such as adhesive. Long rectangular holes 126, 128, and 130 are formed along the subscanning direction respectively in the pressure-generating chamber plate 122, ink-supplying flow-channel plate 120 and flow-channel plate 118; and long rectangular holes 126, 128, and 130 forms a common flow-channel as the flow-channel plate 118, ink-supplying flow-channel plate 120 and pressure-generating chamber plate 122 are laminated, An ink-supplying hole 134 is formed in the vibration plate 124 at the position corresponding to a terminal of the common flow-channel. An ink-supplying apparatus not shown in the Fig. is connected to the ink-supplying hole 134.

Multiple flow-channels 136 (12 channels in FIG. 1) are formed along the main scanning direction as connected to the long rectangular hole 130 in the flow-channel plate 118, and liquid flows through the channels 136, as the ink-supplying flow-channel plate 120, flow-channel plate 118 and nozzle plate 116 are laminated.

The pressure-generating chamber plate 122 has multiple openings for pressure-generating chambers 142 respectively corresponding to the flow-channels 136, and the opening, vibration plate 124 and ink-supplying flow-channel plate 120 form a pressure-generating chamber 142. In addition, piezoelectric elements 144 respectively corresponding to the pressure-generating chambers 142 are connected to the vibration plate 124, and the vibration plate 124 and the piezoelectric elements 144 form flat plate-shaped piezoelectric actuators 154 (piezoelectric actuators) respectively corresponding to the pressure-generating chambers 142.

As shown in FIG. 1, an ink-supplying channel 146 and an ink-discharging channel 148 are formed in the ink-supplying flow-channel plate 120, respectively to each of the pressure-generating chambers 142. In addition, a communicating tube 150 and an ink-ejecting nozzle 152 are formed in the flow-channel plate 118 and the nozzle plate 116 respectively at the position corresponding to each of the ink-discharging channels 148. The ink-discharging channel 148, communicating tube 150 and ink-ejecting nozzle 152 form a nozzle 140. In addition, the pressure-generating chamber 142, nozzle 140 and piezoelectric actuator 154 form an ejector.

As apparent from the sectional view in FIG. 2, an ink channel stretching from the flow-channel 136, pressure-generating chamber 142, ink-discharging channel 148, communicating tube 150 to ink-ejecting nozzle 152 is formed. Ink fed from an ink-supplying apparatus not shown in the Fig. is supplied through the ink-supplying hole 134 into the droplet-ejecting head 112, and the pressure-generating chambers 142 are filled with the ink through the common flow-channel and respective flow-channels 136.

As shown in FIG. 2, the piezoelectric element 144 is formed of a piezoelectric layer 156 and electrode layers 158 and 160 formed at both ends of the piezoelectric layer 156 in the thickness direction. One of the electrode layers 158 and 160 is the first electrode layer, and the other is the second electrode layer. In this embodiment, PZT is used as the piezoelectric layer 156, an Ag alloy containing 10% by weight Pd as the electrode layer 158, and Ti as the electrode layer 160. In such a case, the electrode layer 158 functions as a higher-potential electrode, and the electrode layer 160 as a lower-potential electrode.

Figure 4:
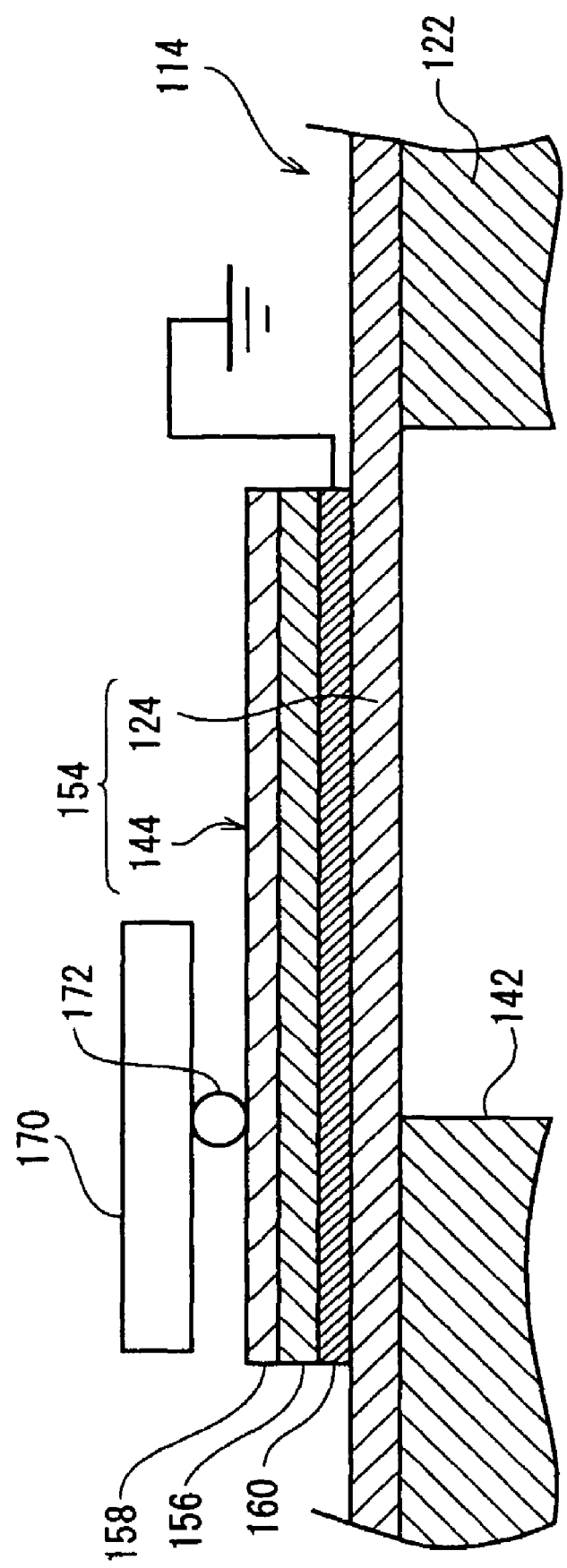
FIG. 4 is a view illustrating the state when the piezoelectric element in the first embodiment is connected to a printed circuit board.

FIG. 4 shows the state when the piezoelectric element in the first embodiment is connected to a printed circuit board. As shown in FIG. 4, a flexible printed circuit board 170 is connected to the electrode layer 158 via a solder 172, so that a voltage can be applied. The electrode layer 160 is grounded.

For example, when a drive voltage having the waveform shown in FIG. 5 according to image information is applied to the piezoelectric element 144, the piezoelectric element 144 deforms and vibrates the vibration plate 124, expanding and contracting the pressure-generating chamber 142. The change in the volume of the pressure-generating chamber 142 causes a pressure wave in the pressure-generating chamber 142. The pressure wave mobilizes the ink in nozzle 140 (ink-discharging channel 148, communicating tube 150; and ink-ejecting nozzle 152) and ejects the ink as droplets out of the ink-ejecting nozzle 152. In particular, in this embodiment, the piezoelectric elements 144 are placed respectively corresponding to the pressure-generating chambers 142, and a piezoelectric element 144 operates independently according to a corresponding pressure-generating chambers 142, as shown in FIGS. 1 and 2. Thus, each of the piezoelectric elements 144 exhibits its piezoelectric properties, independent of the neighboring piezoelectric elements 144.

The piezoelectric element in the first embodiment, which has a layer of an alloy of Ag and Pd having a high standard electrode potential as the higher-potential electrode and a layer of Ti having a lower standard electrode potential than Ag as the lower-potential electrode, hardly causes electrolysis of water. Thus, it is possible to reduce generation of hydrogen ion by electrolysis of water and deterioration of piezoelectric element even when the piezoelectric element is operated under high-humidity environment. In addition, the electrode layer 158 is an alloy containing Ag as the principal component and thus, has soldering capability. As the electrode layer 158 contains Pd, it is possible to reduce the elution of Pb ion from PZT that occurs at higher electric potential as well as electromigration of Ag. The amount of Pd contained in the electrode layer 158 is 10% by weight, and thus, it is possible to reduce the cost of piezoelectric element. Further, the electrodes in the piezoelectric element in the first embodiment, which have a single-layer structure, also allow reduction in the production cost of piezoelectric element.

Figure 6:
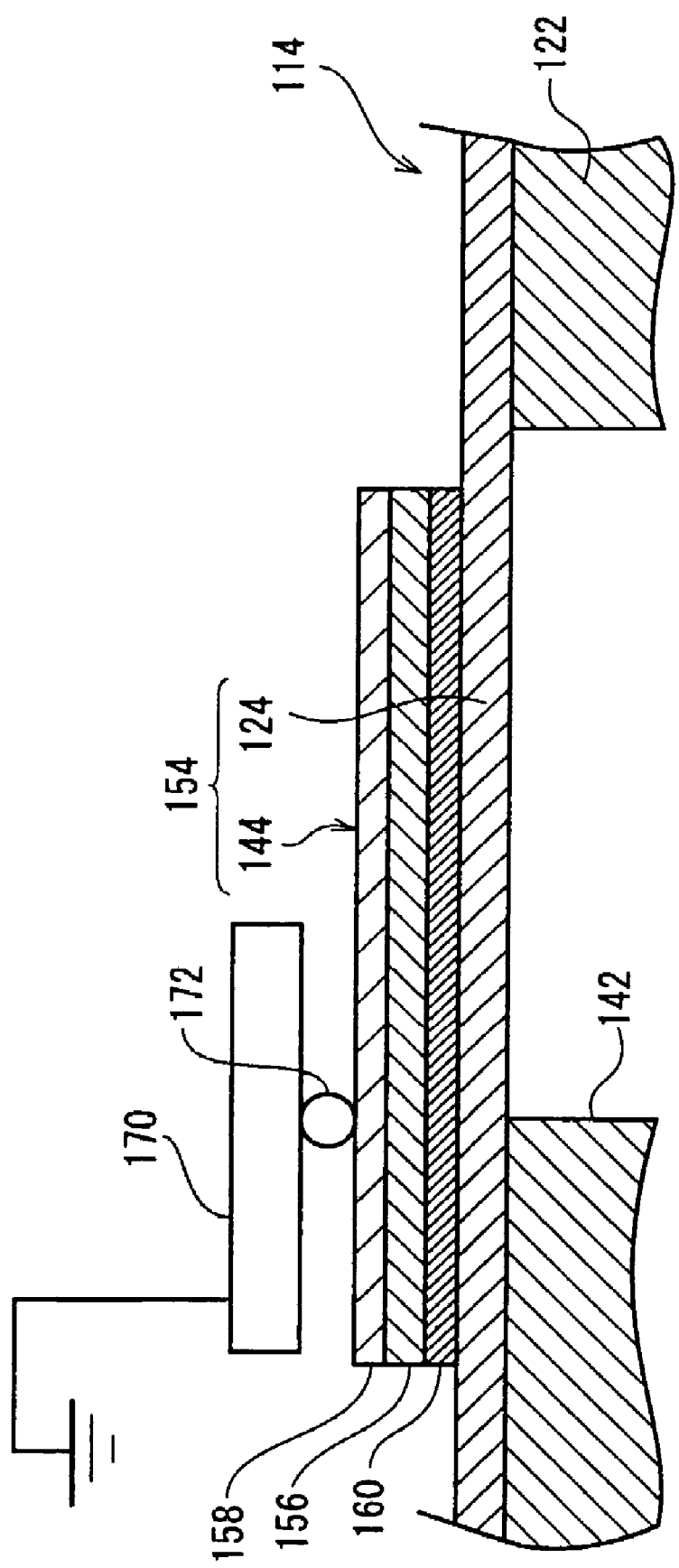
FIG. 6 is a view illustrating the state when the piezoelectric element in the second embodiment is connected to a printed circuit board.

FIG. 6 shows an embodiment (second embodiment) when PZT is used as a piezoelectric layer 156, an Sn alloy containing 15% by weight Pd as an electrode layer 158, and an Ag alloy containing 10% by weight Pd as electrode layer 160. In such a case, the electrode layer 158 functions as the lower-potential electrode, and the electrode layer 160 functions as the higher-potential electrode. A cable not shown in the Fig. for application of voltage is connected to the electrode layer 160. The electrode layer 158 is grounded via a flexible printed circuit board 170.

The piezoelectric element in the second embodiment, which uses a layer of an alloy of Ag and Pd having a high standard electrode potential as the higher-potential electrode and a layer of an alloy of Sn and Pd having a lower standard electrode potential than Ag as the lower-potential electrode, hardly causes electrolysis of water. Thus, it is possible to reduce generation of hydrogen ion by electrolysis of water and deterioration of piezoelectric element, even when the piezoelectric element is operated under high-humidity environment. The electrode layer 158 is an alloy containing Sn as the principal component and thus, has soldering capability. In addition, the electrode layer 158 containing Pd reduces electromigration of Sn. The amount of Pd contained in the electrode layer 158 is 15% by weight, and thus, it is possible to reduce the cost of the piezoelectric element. Further, the electrode layers in the piezoelectric element in the second embodiment have a single layer structure and thus, allow reduction in the production cost of piezoelectric element.

Figure 7:
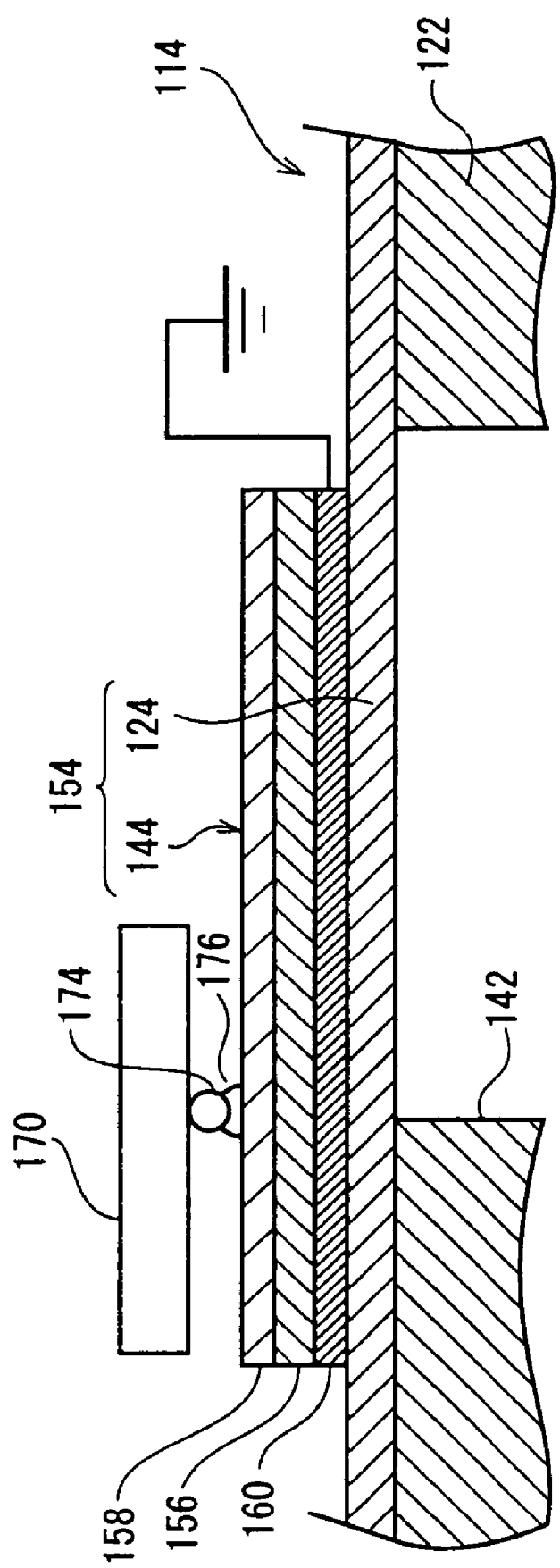
FIG. 7 is a view illustrating the state when the piezoelectric element in the third embodiment is connected to a printed circuit board.

FIG. 7 shows an embodiment (third embodiment) in which PZT is used as the piezoelectric layer 156, a Cu alloy containing 10% by weight Pd as electrode layer 158, and Ti as the electrode layer 160. In such a case, the electrode layer 158 functions as the higher-potential electrode and the electrode layer 160 functions as the lower-potential electrode. Because Cu has no soldering capability, a flexible printed circuit board 170 is adhered to the electrode layer 158 via a bump 174 formed on the flexible printed circuit board 170 to the electrode layer 158 with an anisotropic conductive adhesive (ACP) 176. The electrode layer 160 is grounded.

The piezoelectric element in the third embodiment, which uses a layer of an alloy of Cu and Pd having a high standard electrode potential as the higher-potential electrode and a layer of Ti having a lower standard electrode potential than Ag as the lower-potential electrode, hardly causes electrolysis of water. Thus, it is possible to reduce generation of hydrogen ion by electrolysis of water and deterioration of piezoelectric element, even when the piezoelectric element is operated under high-humidity environment. The electrode layer 158 containing Pd reduces elution of Pb ion from PZT that occurs at higher electric potential. The amount of Pd contained in the electrode layer 158 is 10% by weight, and thus, it is possible to reduce the cost of the piezoelectric element. In addition, the electrode layers in the piezoelectric element in the third embodiment have a single layer structure and thus, allow reduction in production cost of the piezoelectric element. Cu is a metal more resistant to electromigration than Ag, and thus, the piezoelectric element in this embodiment causes fewer troubles due to electromigration than the piezoelectric element in the first embodiment.

Hereinafter, a method of producing the piezoelectric element 144 and droplet-ejecting head 112 in this embodiment will be described with reference to a specific example.

(1) First, electrode layers are formed on the surfaces, on which the first electrode layer and the second electrode layer are formed, respectively, of a piezoelectric PZT member 156 previously fabricated in a desirable thickness—by a gas-phase filming method such as sputtering or vapor deposition.

(2) The laminate thus prepared is divided, for example by blasting or dicing, into pieces having the shape corresponding to the pressure-generating chamber 142 and a structure in which the cross section of the laminated film layers are exposed, to form piezoelectric elements 144.

(3) The piezoelectric elements 144 are bonded to the vibration plate 124 of a laminated flow-channel plate 114 previously prepared from multiple plates, for example, by means of adhesive, forming a piezoelectric actuator 154 comprising the piezoelectric elements 144 and a vibration plate 124.

(4) A flexible printed circuit board 170 is connected to the first electrode layer 158 of piezoelectric element 144 via an electrical contact such as solder junction.

In this manner, it is possible to produce a droplet-ejecting head 112 having the piezoelectric element 144 in this embodiment, but the method of producing the piezoelectric element 144 and the droplet-ejecting head 112 is not limited thereto.

Although embodiments of the invention are described so far, these embodiments are intended only to show favorable embodiments of the invention, and the invention is not limited thereto. In other words, various deformation, modification, correction, and simplification of the embodiments are possible within the scope of the invention.

For example, the flow-channels in the laminate flow-channel plate 114 are formed by lamination of multiple plates in the embodiment above, but the configuration and the materials for the plate are not limited to those in the embodiment above. For example, the flow-channels may be integrally molded by using a material such as ceramic, glass, resin, or silicon.

Although an inkjet-recording head and an inkjet-recording apparatus that record characters and images by ejecting droplets of color inks (ink droplets) on a recording paper P is described in the embodiments above, the droplet-ejecting head and the droplet-ejecting apparatus according to the invention are not limited to those in the inkjet recording process, i.e., those recording characters and images on recording paper. The recording medium is also not limited to paper, and the liquid ejected is also not limited to color ink. The "recording medium" is not limited if it accepts the droplets ejected from the droplet-ejecting head, and similarly, the "image" or the "recorded image" include all dot patterns on a recording medium obtained by deposition of the droplets. Thus, the "recording media" include recording paper, OHP sheet, and the like, as well as various substrates, glass plate, and the like. Examples of the "image" or the "recorded image" include general images (characters, pictures, photography, etc.) as well as circuit pattern on substrate, three dimensional article, organic thin film, and the like. The droplet-ejecting head and the droplet-ejecting apparatus according to the invention may be applied to general droplet-ejecting apparatuses for use in various industrial applications, for example, in preparation of color filters for display by ejecting color inks on a polymer film or glass, preparation of bumps for mounting component by ejecting a solder in the molten state on a substrate, preparation of EL display panels by ejecting an organic EL solution on a substrate, preparation of bumps for mounting electrical parts by ejecting solder in the molten state on a substrate, and the like.

Although droplets are ejected while the droplet-ejecting head is being moved by a carriage in the droplet-ejecting apparatus, the invention may be applied to other forms of apparatuses including an apparatus of recording characters and images by using a line-type droplet-ejecting head in which ink-ejecting nozzles 152 are arrayed over the entire width of the recording medium, in which the line-type printer head is fixed and only a recording medium is conveyed (in such a case, only the main scanning is preformed).

As described above, the invention provides the followings <1> to <22>:

<1> A piezoelectric element, at least comprising a piezoelectric layer, a first higher-potential electrode layer formed in contact with the piezoelectric layer on one face of the piezoelectric layer, and a second lower-potential electrode layer formed in contact with the piezoelectric layer on the face of the piezoelectric layer opposite to the first electrode layer, wherein the first electrode layer contains a metal A having a standard electrode potential of higher than 0 V and a metal B having a standard electrode potential higher than that of the metal A in which the metal A is present in the largest amount by weight of the total amount of the metal elements contained in the first electrode layer and in which the metal B is an amount of 0.5 to 35% by weight with respect to the total amount of the metal elements contained in the first electrode layer, and the second electrode layer contains a metal C having a standard electrode potential lower than that of the metal A in which the metal C is present in the largest amount by weight of the total amount of the metal elements contained in the second electrode layer of the piezoelectric element.

<2> The piezoelectric element described in <1>, wherein the metal A is a metal which can be soldered.

<3> The piezoelectric element described in <1>, wherein the metal A is Ag or Cu.

<4> The piezoelectric element described in <1>, wherein the metal B is Ir, Pt or Pd.

<5> The piezoelectric element described in <1>, wherein the metal C is a metal which can be soldered.

<6> The piezoelectric element described in <1>, wherein the metal C is Sn, Ti, Al, Zn, Cu, Ni or Pb.

<7> The piezoelectric element described in <1>, wherein the standard electrode potential of the metal C is less than 0 V.

<8> The piezoelectric element described in <1>, wherein the metal A is Ag or Cu and the metal C is Sn, Ti, Al, Zn, Cu, Ni or Pb.

<9> The piezoelectric element described in <1>, wherein the metal A is Ag or Cu, the metal B is Ir, Pt or Pd, and the metal C is Sn, Ti, Al, Zn, Cu, Ni or Pb.

<10> The piezoelectric element described in <1>, wherein the second electrode layer contains a metal D having a standard electrode potential higher than that of the metal C additionally in an amount of 0.5 to 35% by weight with respect to the total amount of the metal elements contained in the second electrode layer.

<11> The piezoelectric element described in <10>, wherein the metal A is a metal which can be soldered.

<12> The piezoelectric element described in <10>, wherein the metal A is Ag or Cu.

<13> The piezoelectric element described in <10>, wherein the metal B is Ir, Pt or Pd.

<14> The piezoelectric element described in <10>, wherein the metal C is a metal which can be soldered.

<15> The piezoelectric element described in <10>, wherein the metal C is Sn, Ti, Al, Zn, Cu, Ni or Pb.

<16> The piezoelectric element described in <10>, wherein the standard electrode potential of the metal C is less than 0 V.

<17> The piezoelectric element described in <10>, wherein the metal D is Ir, Pt or Pd.

<18> The piezoelectric element described in <10>, wherein the metal A is Ag or Cu, and the metal C is Sn, Ti, Al, Zn, Cu, Ni or Pb.

<19> The piezoelectric element described in <10>, wherein the metal A is Ag or Cu, the metals B and D are Ir, Pt or Pd, and the metal C is Sn, Ti, Al, Zn, Cu, Ni or Pb.

<20> The piezoelectric element described in <1>, wherein the first and second electrode layers are formed by sputtering or vapor deposition.

<21> A droplet-ejecting head, comprising a pressure-generating chamber in which a liquid is filled, a nozzle connected to the pressure-generating chamber that can eject droplet, and an actuator at least having the piezoelectric element described in <1> to <20> constituting at least part of the wall of the pressure-generating chamber that expands or contracts the pressure-generating chamber by vibration and vibrates the vibration plate by the deformation caused by a voltage applied according to image information.

<22> A droplet-ejecting apparatus, at least comprising the droplet-ejecting head described in <21>.

EXAMPLES

Hereinafter, the present invention will be described in more detail with reference to Examples, but it should be understood that the invention is not limited by these Examples.

In the following Examples and Comparative Examples, a droplet-ejecting head and a droplet-ejecting apparatus having the configuration exemplified in FIGS. 1 to 3 are prepared and evaluated in various tests.

<Preparation of Piezoelectric Element>

A second electrode layer (GND) having a thickness of 0.2 μm is formed on one side of a PZT plate having a thickness of 35 μm. A first electrode layer having a thickness of 0.2 μm, a Ni layer having a thickness of 0.6 μm, and an Au layer having a thickness of 0.2 μm are formed in that order on the face of the PZT plate opposite to the second electrode. The laminated member having respective layers on both faces of the PZT plate is cut into pieces in predetermined shapes by blasting, to give piezoelectric elements 1 to 8. Combinations of the metal contained in the first electrode layer and the metal contained in the second metal layer are shown in Table 1. The metal layers are formed by sputtering or reactive sputtering.

TABLE 1

|  |  | First electrode layer | | Second electrode layer |
|---|---|---|---|---|
|  |  | Metal A | Metal B | Metal C |
| Examples of the invention | Piezoelectric element 1 | Ag (99% by weight) | Pd (1% by weight) | Sn (present as SnO) |
|  | Piezoelectric element 2 | Ag (69% by weight) | Pd (31% by weight) | Sn (present as SnO) |
| Comparative examples | Piezoelectric element 3 | Sn (present as SnO) | None | Sn (present as SnO) |
|  | Piezoelectric element 4 | Ir (present as IrO2) | None | Sn (present as SnO) |
|  | Piezoelectric element 5 | Sn (present as SnO) | None | Au |
|  | Piezoelectric element 6 | Nb (present as NbO) | None | Au |
|  | Piezoelectric element 7 | Ir (present as IrO2) | None | Au |
|  | Piezoelectric element 8 | Au | None | Au |

<Preparation of Droplet-Ejecting Head>

Separately, as shown in FIG. 1 or 2, the surface of each of the piezoelectric elements 1 to 8 is bonded and fixed at the second electrode layer 160 side to a vibration plate 124, and a flexible printed circuit board for application of a high electric potential is connected to the top face of the first electrode layer 158 by soldering, and then, the other regions are also formed according to a common method one by one, to give each of the droplet-ejecting heads 1 to 8 (heads 1 to 8). 3 60 Piezoelectric elements are mounted on the droplet-ejecting head.

<Evaluation>

Subsequently, each of the droplet-ejecting head is placed in the droplet-ejecting apparatus shown in FIG. 3 and operated under a high-temperature and high-humidity environment (38° C. and 80% RH) at a drive voltage of 1 KV/mm having a unipolar waveform for 3×109 cycles.

The rate [failure rate (%)] of the piezoelectric elements having an electrostatic capacity by 2% or more after test lower than the electrostatic capacity of each piezoelectric element before test (100%) is determined at the time. Results are summarized in FIG. 8. In FIG. 8, the relative standard electrode potential of metal A is plotted on abscissa, while the failure rate of droplet-ejecting head on ordinate.

As apparent from FIG. 8, the failure rate is smaller when the higher-potential electrode has a greater standard electrode potential and the lower-potential electrode has a smaller standard electrode potential. The head 4 has a low failure rate, but is less advantageous in cost than heads 1 and 2, because Ir is expensive.

In addition, the failure rate of the droplet-ejecting heads 1 and 2 after operation under the condition above for 2.1×1010 cycles is 0%.

As described above, the invention provides a piezoelectric element capable of preventing deterioration over time under high-temperature and high-humidity environment, a droplet-ejecting head using the piezoelectric element, and a droplet-ejecting apparatus using the droplet-ejecting head.

What is claimed is:

1. A piezoelectric element, at least comprising a piezoelectric layer, a first higher-potential electrode layer formed in contact with the piezoelectric layer on one face of the piezoelectric layer, and a second lower-potential electrode layer formed in contact with the piezoelectric layer on the face of the piezoelectric layer opposite to the first electrode layer, wherein the first electrode layer contains a metal A having a standard electrode potential of higher than 0 V and a metal B having a standard electrode potential higher than that of the metal A in which the metal A is present in the largest amount by weight of the total amount of the metal elements contained in the first electrode layer and in which the mental B is an amount of 0.5 to 35% by weight with respect to the total amount of the metal elements contained in the first electrode layer, and the second electrode layer contains a metal C having a standard electrode potential lower than that of the metal A in which the metal C is present in the largest amount by weight of the total amount of the metal elements contained in the second electrode layer of the piezoelectric element.

2. The piezoelectric element according to claim 1, wherein the metal A is a metal which can be soldered.

3. The piezoelectric element according to claim 1, wherein the metal A is Ag or Cu.

4. The piezoelectric element according to claim 1, wherein the metal B is Ir, Pt or Pd.

5. The piezoelectric element according to claim 1, wherein the metal C is a metal which can be soldered.

6. The piezoelectric element according to claim 1, wherein the metal C is Sn, Ti, Al, Zn, Cu, Ni or Pb.

7. The piezoelectric element according to claim 1, wherein the standard electrode potential of the metal C is less than 0 V.

8. The piezoelectric element according to claim 1, wherein the metal A is Ag or Cu and the metal C is Sn, Ti, Al, Zn, Cu, Ni or Pb.

9. The piezoelectric element according to claim 1, wherein the metal A is Ag or Cu, the metal B is Ir, Pt or Pd, and the metal C is Sn, Ti, Al, Zn, Cu, Ni or Pb.

10. The piezoelectric element according to claim 1, wherein the second electrode layer contains a metal D having a standard electrode potential higher than that of the metal C additionally in an amount of 0.5 to 35% by weight with respect to the total amount of the metal elements contained in the second electrode layer.

11. The piezoelectric element according to claim 10, wherein the metal A is a metal which can be soldered.

12. The piezoelectric element according to claim 10, wherein the metal A is Ag or Cu.

13. The piezoelectric element according to claim 10, wherein the metal B is Ir, Pt or Pd.

14. The piezoelectric element according to claim 10, wherein the metal C is a metal which can be soldered.

15. The piezoelectric element according to claim 10, wherein the metal C is Sn, Ti, Al, Zn, Cu, Ni or Pb.

16. The piezoelectric element according to claim 10, wherein the standard electrode potential of the metal C is less than 0 V.

17. The piezoelectric element according to claim 10, wherein the metal D is Ir, Pt or Pd.

18. The piezoelectric element according to claim 10, wherein the metal A is Ag or Cu, and the metal C is Sn, Ti, Al, Zn, Cu, Ni or Pb.

19. The piezoelectric element according to claim 10, wherein the metal A is Ag or Cu, the metals B and D are Ir, Pt or Pd, and the metal C is Sn, Ti, Al, Zn, Cu, Ni or Pb.

20. The piezoelectric element according to claim 1, wherein the first and second electrode layers are formed by sputtering or vapor deposition.

21. A droplet-ejecting head, comprising
a pressure-generating chamber into which a liquid is filled,
a nozzle connected to the pressure-generating chamber that can eject droplet, and
an actuator at least having the piezoelectric element according to claim 1 constituting at least part of the wall of the pressure-generating chamber that expands or contracts the pressure-generating chamber by vibration and vibrates the vibration plate by deformation caused by a voltage applied according to image information.

22. A droplet-ejecting apparatus, at least comprising the droplet-ejecting head according to claim 21.

* * * * *